United States Patent [19]

Flesner

[11] Patent Number: 5,049,753
[45] Date of Patent: Sep. 17, 1991

[54] OPTICALLY POWERED CHARGED PARTICLE ACCELERATOR

[75] Inventor: Larry D. Flesner, San Diego, Calif.

[73] Assignee: The United States of America as represented by the Secretary of the Navy, Washington, D.C.

[21] Appl. No.: 549,885

[22] Filed: Jun. 28, 1990

[51] Int. Cl.$^5$ .............................................. H01J 5/50
[52] U.S. Cl. ................................ 250/396 R; 313/531; 328/233
[58] Field of Search ................... 250/396 R, 310, 311; 313/531; 328/233

[56] References Cited

U.S. PATENT DOCUMENTS

| | | | |
|---|---|---|---|
| 3,245,636 | 4/1966 | Null | 244/1 |
| 3,676,670 | 7/1972 | Dao et al. | 250/311 |
| 3,778,312 | 12/1973 | Karius | 136/89 |
| 3,875,440 | 4/1975 | McGee | 313/531 |
| 3,933,323 | 1/1976 | Dudley et al. | 244/1 R |
| 3,989,994 | 11/1976 | Brown | 321/1.5 |
| 4,156,309 | 5/1979 | Routh et al. | 29/572 |
| 4,710,283 | 12/1987 | Singh et al. | 204/298 |
| 4,742,232 | 5/1988 | Biddle et al. | 250/427 |

OTHER PUBLICATIONS

Appl. Phys. Lett. 51(2), Jul. 13, 1987 "Picosecond photoelectron scanning electron microscope for noncontact testing of integrated circuits".

Primary Examiner—Jack I. Berman

[57] ABSTRACT

A charged particle control apparatus provides very high voltage particle beams. One or more photocell arrays provide bias voltages for beam accelerating stages. The arrays are made from a number of microfabricated photocells connected in series to produce a voltage output that is the sum of the voltages from the individual cells. Arrays of each stage are connected in series to produce a cumulative stage voltage that is applied to an accelerating electrode made part of the stage.

These accelerating stages are disposed within a transparent vacuum chamber and are spaced from a charged particle source stage disposed near one end of the chamber. This charged particle source stage includes an emission source such as a photocathode. The photo arrays of the accelerating stages are connected in series to produce a potential that is applied to the particle source stage.

Optical power illuminates the stages to generate desired voltage biases to the accelerating electrodes. A light source is used to excite the photocathode when this emission source is used. Electrons from the emission source are accelerated by the accelerating electrodes and are emitted from the chamber which is typically conjoined with other apparatus.

By utilizing photocell arrays to generate beam current and accelerating biases, as well as a photocathode for providing a source of electrons, the apparatus of the invention is completely optically isolated thereby requiring no direct electrical connections to the apparatus even though multiple accelerating stages are used to facilitate the achievement of very high voltage particle beams.

18 Claims, 3 Drawing Sheets

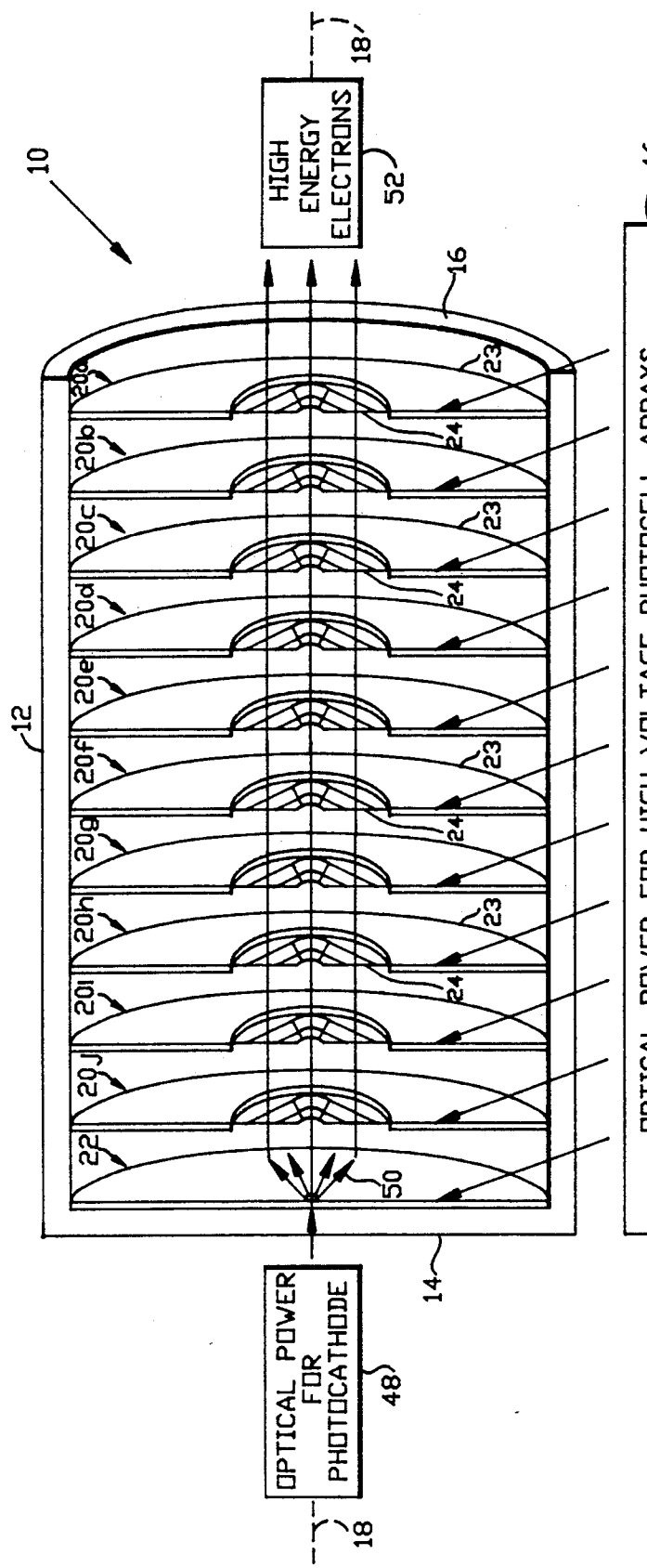
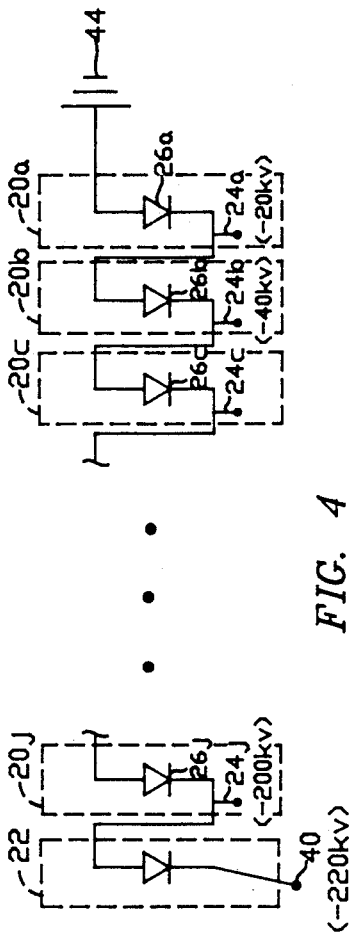
FIG. 1
FIG. 4

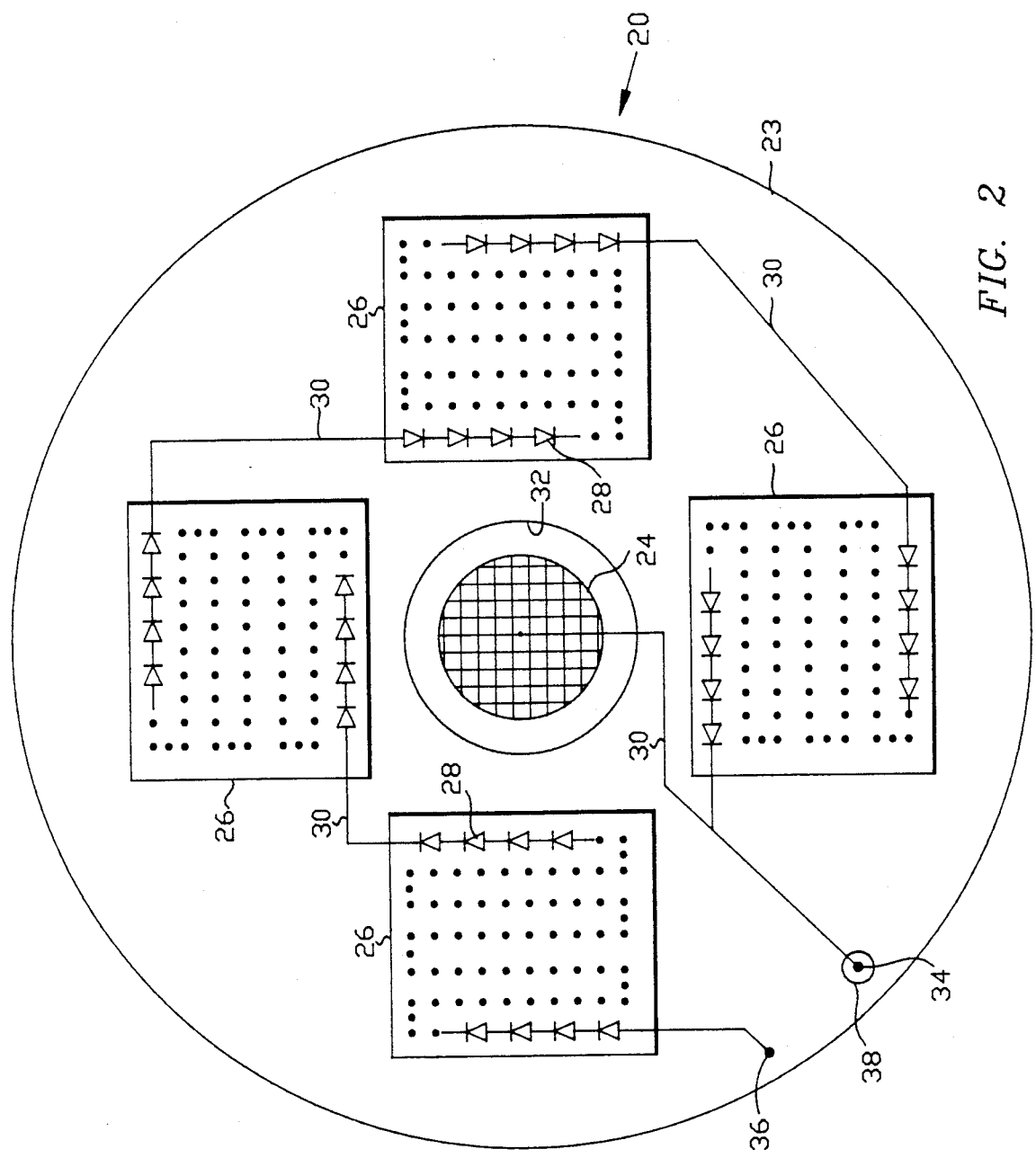

OPTICALLY POWERED CHARGED PARTICLE ACCELERATOR

STATEMENT OF GOVERNMENT INTEREST

The invention described herein may be manufactured and used by or for the Government of the United States of America for governmental purposes without the payment of any royalties thereon or therefore.

INCORPORATION BY REFERENCE

U.S. Pat. No. 4,156,309 issued to Donald E. Routh; Ben R. Hollis; and William R. Feltner titled "Method of Construction of a Multi-Cell Solar Array" is incorporated by reference herein. Also incorporated herein is the article "Picosecond Photoelectron Scanning Electron Microscope for Noncontact Testing of Integrated Circuits" by P. May; J. M. Halbout; and G. Chiu found in Applied Physics Letters, Vol 51, No. 2 of July 13, 1987.

BACKGROUND OF THE INVENTION

1. Field of the Invention

The invention pertains broadly to the field of charged particle accelerators. More particularly, but without limitation thereto, the invention relates to an optically powered high voltage electron accelerator.

2. Description of the Related Art

Over the years the production and adequate control of high voltage charged particle beams has prove to be increasingly useful. For example, ion beams are commonly used in the semiconductor industry. Here, an ion beam contributes to the sputtering or implantation of various elements during the course of semiconductor production. Electron beams have proven their usefulness in radiation simulation and in electron microscopy.

To generate either ion or electron beams, high voltage power is necessary to provide beam current and accelerating bias. For example, in electron microscopy electron accelerating voltages range anywhere from a few hundred to a million volts. High accelerating voltages have proven useful for high resolution transmission electron microscopy.

In a typical charged particle accelerator a number of accelerating "stages" may be used to provide desired particle acceleration. Each of these stages are voltage biased to create an accelerating force for a charged particle such as an electron. One form of charge particle accelerator employs static bias voltages.

Various techniques for providing necessary voltages to the accelerating stages are available. Typically, heavily insulated cables are passed from a power source into a vacuum chamber that houses the accelerating stages. To adequately control the production of charged particles such as electrons it is necessary to maintain a charged particle control device within a vacuum; however to pass cables into the vacuum without allowing unwanted current flow due to breakdown effects becomes increasingly difficult when higher voltages are used.

In an alternative arrangement, a charged particle accelerator may incorporate a power generating source or sources within a vacuum chamber. The invention described herein teaches such an arrangement.

SUMMARY OF THE INVENTION

The invention provides a charged particle accelerator capable of very high voltage electron or ion beams. One or more accelerating "stages" are provided by the invention with each of these accelerating stages including a support plate, a high voltage "bias" supply and an accelerating electrode structure. The high voltage bias supplies are each made up of one or more high voltage photocell arrays that individually include a large number of microfabricated photocells. The photocells of each array are connected in series circuit to produce a voltage output that is the sum of the voltages from the individual cells. More than one array may be utilized per stage with these arrays being likewise connected in series to produce a cumulative stage voltage. Parallel linkage of these arrays may also be employed to provide summation of currents. The voltage produced by each stage array or arrays is applied to the accelerating electrode made part of the accelerating stage structure.

The accelerating stages are disposed within a transparent vacuum chamber and are spaced from a charged particle source stage disposed near one end of the chamber. This charged particle source stage includes an emission source such as a photocathode. The particle source stage and accelerating stages are electrically connected.

Optical power is utilized to illuminate the stages to generate desired voltage biases. In the case in which a photocathode emission source is used, optical power from a light source is used to excite the photocathode. The electrons emitted from the emission source are accelerated through the accelerating electrode structures by the biasing voltages provided by each accelerating stage. High voltage electron beams are emitted through an exit end of the chamber to be utilized as desired.

In addition to accelerating the charged particles, the optically produced bias voltages may also be used to otherwise control a particle beam. Examples of such control include focusing and deflecting the beam.

By utilizing photocell arrays to provide beam current and accelerating and control biases, as well as a photocathode for providing a source of electrons, the apparatus of the invention may be completely optically isolated. This optical isolation requires no direct electrical connections to be made to the apparatus thereby substantially overcoming the complexity of prior art charged particle accelerators and control apparatus.

OBJECTS OF THE INVENTION

It is an object of the invention to provide an improved charged particle accelerator/control apparatus.

Another object of the invention is to provide a charged particle accelerator/control apparatus that is simple in design.

Other objects, advantages and new features of the invention will become apparent from the following detailed description of the invention when considered in conjunction with the accompanied drawings.

BRIEF DESCRIPTION OF THE DRAWINGS

FIG. 1 is a side section view of a charged particle accelerator according to the invention.

FIG. 2 is a schematical representation of an accelerating stage as utilized in a accordance with the invention.

FIG. 4 is a schematical representation of the charged particle accelerator shown in FIG. 1.

DESCRIPTION OF THE PREFERRED EMBODIMENT

Figure 3:
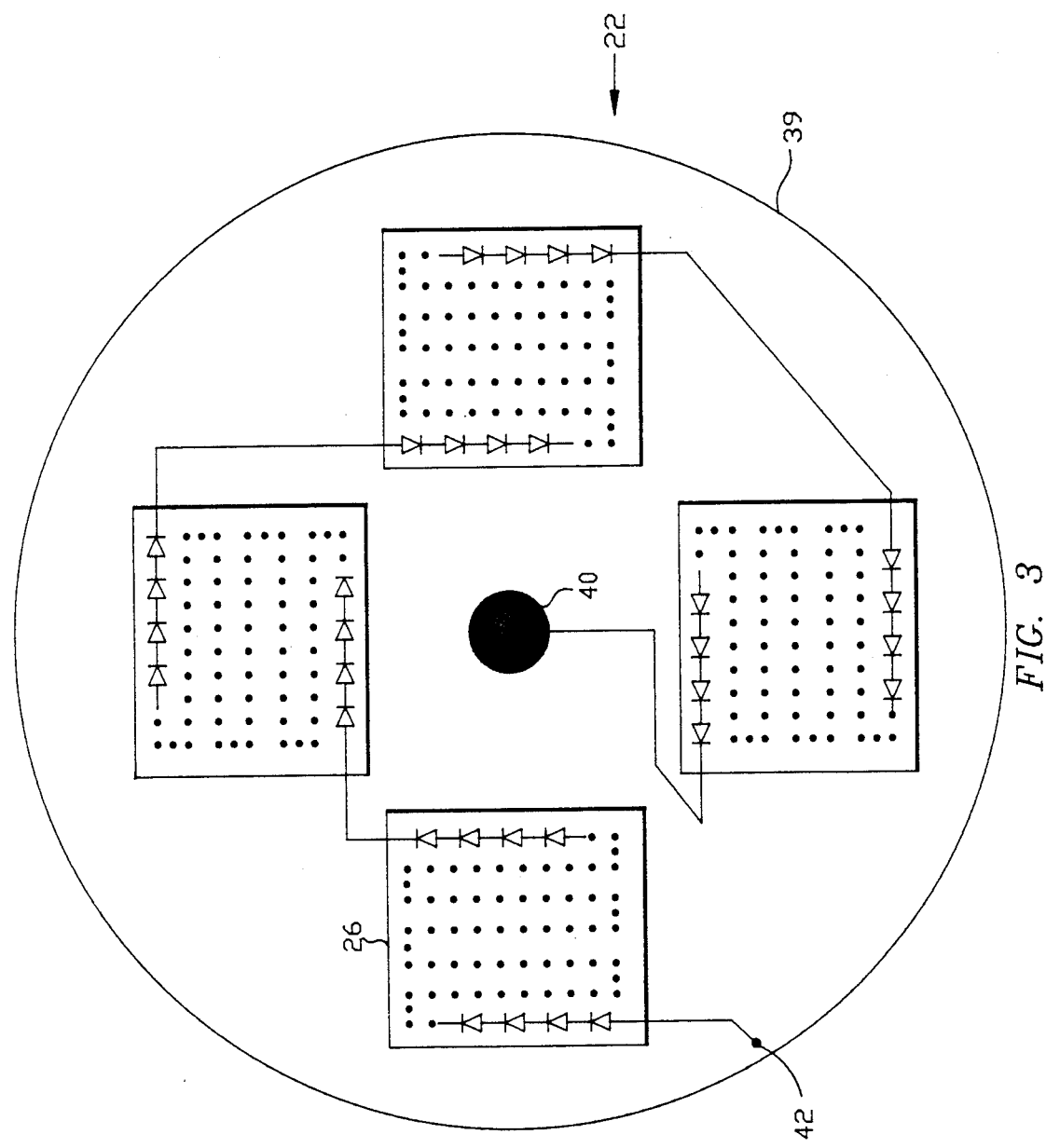
FIG. 3 is a schematical representation of a charged particle source stage as is utilized with the invention.

Referring to FIG. 1 a charged particle accelerator 10 according to the invention is shown. Apparatus 10 includes a transparent vacuum chamber 12, shown in sectional view, that has one end 14, an exit end 16 and a longitudinal axis 18. The exit end of this chamber is conjoined with additional apparatus or structures not shown so that chamber 16 can surround a vacuum environment. Transparent chamber 12 may be fabricated of quartz, for example.

As can be seen a plurality of particle accelerating stages 20, shown in sectional view, are disposed within chamber 12 and are spaced along axis 18 of the chamber. Also shown within FIG. 1 is a sectional view of a charged particle source stage 22.

One or more particle accelerating stages 20 may be used with charged particle accelerator 10, FIG. 1 showing a representative number of these stages. Each particle accelerating stage includes a support plate 23 and an accelerating electrode structure 24 through which a particle beam current is accelerated by an applied voltage bias. This particle beam may in general include either electrons or ions.

In the embodiment of the invention shown, electrode structure 24 takes the form of a grid; however, those skilled in the art will know that accelerating electrodes are well established and that electrodes of other designs may be used in the invention. An example is a multi-electrode structure such as an Einzel lens which serves to focus as well as accelerate a particle beam. Another example is an electrode structure designed to deflect a beam. To supply high voltage potentials to these electrode structures each particle accelerating stage 20 includes a plurality of photocells.

Referring now to FIG. 2 a representative particle accelerating stage 20 as may be utilized with the invention is shown. As can be seen, stage 20 includes support plate 23 that has disposed thereon one or more photocell arrays 26. The plate 23 which supports the arrays as well as accelerating electrode 24 is preferably a transparent insulator such as sapphire or glass. The photocell arrays may be fabricated directly on support plate 23 or otherwise attached to it.

In a specific embodiment of the invention each of these arrays includes ten thousand microfabricated photocells. Photocells of this type such as silicon p-n photovoltaic cells fabricated on an insulating substrate such as sapphire are well known to the art. A representative example of these photocells as well as a process for making them is disclosed in U.S. Pat. No. 4,156,309 incorporated by reference herein.

Photocells 28, within photocell arrays 26, are connected in series circuit to produce a combined voltage from each array. As can be seen each array 26 is then in turn series connected so that each particle accelerating stage 20 produces a cumulative stage voltage. Electrical connections 30 provide these series connections and also provide that arrays 26 are operably coupled to accelerating electrode 24 also shown in FIG. 1. In the embodiment of the invention shown, electrode 24 is suspended within an aperture 32 defined in plate 23. More complex accelerating electrode structures may incorporate more complex bias schemes.

Referring now to FIGS. 1 and 2 each particle accelerating stage 20 is constructed substantially identically. In a specific embodiment a cumulative stage voltage produced by the arrays of photocells of a single stage is approximately 20 kilovolts. This value is chosen to prevent undesirable electron field emissions or breakdown phenomena that might occur at higher values. In FIG. 2 it can be seen that each particle accelerating stage 20 includes an output junction 34 and an input junction 36. An aperture 38 is defined in plate 23 to facilitate interconnection of stages.

Each of the particle accelerating stages 20 are connected in series to produce a progressing rate of electrode biasing voltages. Referring again to FIGS. 1 and 2 these connections will be further explained. Particle accelerating stage 20a has its input junction 36 connected to ground. Output junction 34 of stage 20a is in turn connected to the input 36 of accelerating stage 20b and so on and so forth until the voltage from stages 20a through stages 20j is applied to charged particle source stage 22. Referring now to FIG. 3, a representative embodiment of this stage is shown.

Source stage 22 includes a support plate 39 with an emission source 40 applied thereto. Plate 39, like plates 23, is preferably a transparent insulator such as sapphire or glass. In a specific embodiment of the invention, emission source 40, attached to plate 39, is a photocathode that, when properly excited, emits a stream of electrons. A suitable photocathode is described in the article of P. May et. al. referred to above and incorporated by reference herein. Of course other sources of electrons may be used. For applications requiring an ion beam, source 40 is any suitable ion source. It is to be understood that in general charged particle emission sources may incorporate additional electrodes and structures other than those shown.

Referring now to FIGS. 1 through 3, the voltage provided by particle accelerating stages 20a through 20j is applied to input 42 of source stage 22. As can be seen source stage 22 is constructed to include additional arrays 26 which provide accelerating potential and/or biasing requirements for source 40. Referring now to FIGS. 1 and 4 operation of the invention will be explained. In FIG. 4 a representative schematic of charged particle control apparatus 10 is shown. The photocell arrays of accelerating stage 20a are shown as a single photo diode symbol 26a. Arrays 26a are electrically connected to a ground 44 and to accelerating electrode 24a. In a preferred embodiment of the invention photocell arrays 26a, when illuminated by optical power source 46, produce approximately 20 kilovolts (negative convention). The negative 20 kilovolts produced by arrays 26a of stage 20a is serially connected to arrays 26b of stage 20b. As all of the particle accelerating stages 20 are designed to perform substantially identically, the potential applied to accelerating electrode 24b of accelerating stage 20b is an additional minus 20 kilovolts and so on and so forth until a −200 kilovolts (kV) is applied to accelerating electrode 24j of particle accelerating stage 20j. The accelerating electrodes 24 of stages 20a through 20j are designed so that a charged particle drawn from the accelerating electrode of one stage to the next will only "see" a voltage difference of about 20,000 volts change.

Accelerating stages 20a through 20j of −200 kV are connected to charged particle source stage 22. As can be seen in FIG. 3 this stage also includes its own photocell arrays to provide the potential applied to emission source 40 of the stage. In a specific embodiment of the invention arrays 26 of stage 22 produce an additional −20 kV potential so that a potential of negative two hundred and twenty kV is applied to emission source 40 relative to ground 44.

In a preferred embodiment, emission source 40 is a photocathode that, when excited by optical power source 48, emits electrons 50. Emitted electrons 50 are then progressively accelerated through the potentials of particle accelerating stages 20 to eventually be delivered as high energy electrons 52. The electrons are then utilized as desired within additional apparatus, not shown, to which vacuum chamber 12 is conjoined.

In the embodiment shown, charged particles are projected substantially linearly from apparatus 10; however those skilled in the art will realize that suitably designed electrode structures may be employed to focus or deflect the beam, as might be required for electron microscopy or other applications. Such focusing and deflecting electrodes may also be biased by optical power according to these teachings.

So that the charged particles utilized in apparatus 10 are not absorbed by atmospheric gases the interior of chamber 12 must be maintained as a vacuum. Optical power sources 46 and 48 may remain outside of this vacuum if transparent vacuum chamber 12 is utilized. These sources may also be included together within chamber 12 in a vacuum.

Other alternative uses and constructions of the invention are of course possible. Besides using a photocathode, other charged particle emission sources could be utilized with the invention however these may not preserve the optical isolation of the apparatus. For example, such sources may be of the thermionic or field emission type. The thermionic source could be heated by laser or other optical source. In addition, the optical power sources used to illuminate the photocell arrays of the invention as well as a photocathode emission source may come from one or a variety of sources such as lasers or light emitting diodes, for example.

Those of ordinary skill in the art will realize that by increasing the number of accelerating stages of apparatus 10, high energy charged particle beams are attainable with voltages possibly reaching as high as or in excess of one million volts. Voltages at these levels are realizable without the complexity or clumsiness that traditional voltage generating sources present. A Van de Graff generator is one example of such a traditional source. By providing an optically isolated charged particle accelerator/control apparatus, the invention shows how voltage generating sources may conveniently be placed within a vacuum environment and thereby eliminate the need for passing high voltage carrying cables into a vacuum chamber. By eliminating these shortcomings the invention provides a simple, relatively small charge particle control apparatus that may be utilized for a wide variety of applications.

Obviously, many modifications and variations of the invention are possible in light of the above teachings. It is therefore to be understood that within the scope of the appended claims the invention may be practiced otherwise than as has been specifically described.

What is claimed is:

1. A apparatus comprising:
   means for emitting electrically charged particles into a vacuum; and
   optically powered means for controlling said electrically charged particles.

2. An apparatus according to claim 1 in which said optically powered control means includes at least one microfabricated photocell array.

3. An apparatus according to claim 2 in which said charged particles include ions.

4. An apparatus according to claim 2 in which said charged particles include electrons.

5. An apparatus according to claim 4 in which said means for emitting electrically charged particles includes a photocathode.

6. A charged particle control apparatus comprising:
   a vacuum chamber for providing a vacuum environment;
   a source for emitting electrons into said vacuum environment; and
   an optically powered means for accelerating said electrons.

7. An apparatus according to claim 6 in which said optically powered accelerating means includes microfabricated photocell arrays.

8. An apparatus according to claim 7 in which said source for emitting electrons includes a photocathode.

9. A charged particle control apparatus comprising:
   a vacuum chamber for providing a vacuum environment;
   a source for emitting electrons into said vacuum environment; and
   an optically powered means for deflecting said electrons.

10. An apparatus according to claim 9 in which said optically powered deflecting means includes microfabricated photocell arrays.

11. An apparatus according to claim 10 in which said source for emitting electrons includes a photocathode.

12. A charged particle control apparatus comprising:
    a vacuum chamber for providing a vacuum environment;
    a source for emitting electrons into said vacuum environment; and
    an optically powered means for focusing said electrons.

13. An apparatus according to claim 12 in which said optically powered focusing means includes microfabricated photocell arrays.

14. An apparatus according to claim 13 in which said source for emitting electrons includes a photocathode.

15. An electron accelerating apparatus comprising:
    a source of optical power;
    a photocathode, said photocathode providing an emission source of electrons when excited by said optical power; and
    an optically powered accelerating means for accelerating said electrons, said optically powered accelerating means including
    a plurality of accelerating stages, each stage including at least one photocell array and an accelerating electrode operably coupled to said photocell array, said at least one photocell array producing voltage when illuminated by said optical power with said voltage being applied to said accelerating electrode.

16. An apparatus according to claim 15 in which said at least one photocell array includes a plurality of microfabricated photocells.

17. An apparatus according to claim 15 in which said accelerating stages and said photocathode are operably connected.

18. An apparatus according to claim 17 in which said at least one photocell array includes a plurality of microfabricated photocells.

* * * * *

UNITED STATES PATENT AND TRADEMARK OFFICE
CERTIFICATE OF CORRECTION

PATENT NO. : 5,049,753

DATED : 17 September 1991

INVENTOR(S) : Larry D. Flesner

It is certified that error appears in the above-identified patent and that said Letters Patent is hereby corrected as shown below:

On the title page, before item [57], insert the following:

--Attorney, Agent, or Firm--Harvey Fendelman; Thomas Glenn Keough; Peter A. Lipovsky--.

Signed and Sealed this

Fifth Day of January, 1993

Attest:

DOUGLAS B. COMER

*Attesting Officer*  *Acting Commissioner of Patents and Trademarks*